(12) United States Patent
Stiegler et al.

(10) Patent No.: US 10,615,107 B2
(45) Date of Patent: Apr. 7, 2020

(54) POWER ELECTRONIC SWITCHING DEVICE COMPRISING A PLURALITY OF POTENTIAL SURFACES

(71) Applicant: Semikron Elektronik GmbH & Co., KG, Nürnberg (DE)

(72) Inventors: Frank Stiegler, Nürnberg (DE); Stefan Schmitt, Fürth (DE); Harald Kobolla, Seukendorf (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 15/356,598

(22) Filed: Nov. 20, 2016

(65) Prior Publication Data

US 2017/0148710 A1 May 25, 2017

(30) Foreign Application Priority Data

Nov. 20, 2015 (DE) ........................ 10 2015 120 157

(51) Int. Cl.
*H01L 23/495* (2006.01)
*H01L 23/00* (2006.01)
(Continued)

(52) U.S. Cl.
CPC ........ *H01L 23/49575* (2013.01); *H01L 23/36* (2013.01); *H01L 23/3735* (2013.01); *H01L 23/50* (2013.01); *H01L 23/5386* (2013.01); *H01L 24/06* (2013.01); *H01L 24/32* (2013.01); *H01L 24/48* (2013.01); *H01L 24/49* (2013.01); *H02M 7/003* (2013.01); *H01L 2224/05552* (2013.01); *H01L 2224/0603* (2013.01); *H01L 2224/4846* (2013.01);
(Continued)

(58) Field of Classification Search
USPC ......................................................... 257/676
See application file for complete search history.

(56) References Cited

U.S. PATENT DOCUMENTS

2008/0210932 A1* 9/2008 Yukawa ................. B82Y 10/00
257/40
2011/0156229 A1 6/2011 Shinohara
(Continued)

FOREIGN PATENT DOCUMENTS

DE 10 2007 006 706 A1 8/2008
DE 10 2014 102 018 B3 2/2015

OTHER PUBLICATIONS

German Patent Office Office Action dated Aug. 9, 2016 in priority application (in German).

*Primary Examiner* — Timor Karimy
(74) *Attorney, Agent, or Firm* — The Law Offices of Roger S. Thompson

(57) ABSTRACT

A power electronic switching device having plurality of potential surfaces. At least two different potentials are respectively assigned to at least one of the potential surfaces. A plurality of semiconductor components are arranged in an n×m matrix, oriented in the x-y-direction, on a first conductor track, formed by at least one potential surface of the first potential. The semiconductor components are connected in parallel with one another and form a current valve. In this case, the semiconductor components can be distributed among a plurality of potential surfaces of the first potential which form the first conductor track.

14 Claims, 4 Drawing Sheets

(51) Int. Cl.
*H01L 23/373* (2006.01)
*H01L 23/50* (2006.01)
*H01L 23/36* (2006.01)
*H01L 23/538* (2006.01)
*H02M 7/00* (2006.01)

(52) U.S. Cl.
CPC .................. *H01L 2224/4847* (2013.01); *H01L 2224/48137* (2013.01); *H01L 2224/48139* (2013.01); *H01L 2224/4903* (2013.01); *H01L 2224/49111* (2013.01); *H01L 2224/49113* (2013.01); *H01L 2924/00014* (2013.01); *H01L 2924/13055* (2013.01); *H01L 2924/13091* (2013.01); *H01L 2924/1427* (2013.01); *H01L 2924/19107* (2013.01)

(56) References Cited

U.S. PATENT DOCUMENTS

| | | |
|---|---|---|
| 2013/0092960 A1 | 4/2013 | Wilcox et al. |
| 2015/0237727 A1 | 8/2015 | Spang et al. |

\* cited by examiner

POWER ELECTRONIC SWITCHING DEVICE COMPRISING A PLURALITY OF POTENTIAL SURFACES

BACKGROUND OF THE INVENTION

1. Field of the Invention

The invention is directed to a power electronic switching device of the kind that is a basic element of power semiconductor modules or more complex power electronic systems. A single current valve is taken as a basis here, although the inventive concept is of course also directly applicable to a plurality of current valves, for example arranged in half- or full-bridge topology by way of example within a power semiconductor module.

2. Description of the Related Art

The prior art includes, for example, German Patent Application No. DE 10 2014 102 018 B3. This application discloses a power electronic switching device comprising two current valves each respectively on a potential surface, formed as a respective conductor track of a routine substrate in the art. The current valves are formed in each case from a plurality of parallel-connected semiconductor components, here IGBTs and antiparallel-connected diodes. Here second load contact surfaces of an IGBT and of a diode that in each case face away from the substrate are directly connected to one another by bond wires. The respective IGBT, or the second contact surface thereof, is furthermore connected to a potential surface having a different potential by a wire bond connection routed further.

Routine connection devices in the art which are used in such switching devices are the wire bond connections mentioned, which here should also be understood to mean ribbon bond connections, and also modern connection devices based on film stacks and known for example from German Patent Application No. DE 10 2007 006 706 A1.

SUMMARY OF THE INVENTION

It is an object of the invention is to provide an improved power electronic switching device, having an improved current-carrying capacity and allowing homogeneous loading of the semiconductor components forming a current valve.

The inventive power electronic switching device is formed with a substrate having a plurality of potential surfaces, i.e., surfaces being at an electrical potential. The potential surfaces have at least two different potentials which are each respectively assigned to at least one of the potential surfaces. On a first conductor track, formed by at least one potential surface of the first potential, a plurality of semiconductor components are arranged in an n×m matrix, oriented in the x-y-direction. The semiconductor components are connected in parallel with one another and form a current valve. In this case, "n" is at least one and the n semiconductor components are arranged alongside one another in the x-direction, while "m" is greater than one and the m semiconductor components are arranged alongside one another in the y-direction. In this case, the semiconductor components can be distributed among a plurality of potential surfaces of the first potential which form the first conductor track. The orientation in the x-y-direction should not be understood to mean an orientation in the mathematically strict sense, but rather a basic orientation which includes certain positional tolerances, without departing from the basic concept of the matrix-like arrangement.

A second conductor track, formed by at least one potential surface of the second potential, is arranged alongside the first conductor track on both sides in the x-direction. The semiconductor components are electrically conductively connected to the first conductor track by their respective first load contact surface facing the conductor track, while the second load contact surfaces of the n semiconductor components arranged alongside one another in the x-direction are conductively connected to one another. In addition, the respective outermost semiconductor components in the x-direction are electrically conductively connected to the potential surface of the second potential arranged alongside, that is to say the second conductor track.

It is advantageous in each case if the electrically conductive connections between the second load contact surfaces of the power semiconductor components among one another are formed by a first connection device and the respective electrically conductive connections between the second load contact surfaces of the power semiconductor components and the assigned potential surfaces alongside the first conductor track laterally in the x-direction are formed by the second connection device. In particular, the first and second connection devices can essentially be formed technically identically, in principle.

One preferred variant here is if one or both of the first and second connection device(s) is/are formed as a wire bond connection, or as a ribbon bond connection as mentioned above.

A further preferred variant here is if one or both of the first or second connection device(s) is/are formed as a film stack in accordance with the prior art mentioned above.

It may be preferred if a potential surface of the second potential encompasses the first conductor track in a U-shaped fashion and in this case has regions which are arranged alongside the conductor track laterally in the x-direction.

It is particularly preferred if two potential surfaces respectively of the second potential are arranged alongside the first conductor track laterally in the x-direction, and wherein the second potential surfaces are electrically conductively connected to one another by a third connection device. In this case, the third connection device can span one or more potential surfaces of the first potential. For this purpose, the third connection device can be formed as a wire bond connection or as a film stack.

It may furthermore be preferred if a plurality of potential surfaces of the first potential are electrically conductively connected to one another by a fourth connection device. For this purpose, the fourth connection device can be formed as a wire bond connection or as a film stack or as a solder bridge.

It is particularly advantageous here if all the connection devices of a power electronic switching device are basically formed essentially identically, particularly if they are formed as film stacks. It is particularly advantageous if they all degenerate into a single film stack.

One advantageous variant of the power electronic switching device according to the invention arises if the switching device is formed symmetrically with respect to a first axis of symmetry in the y-direction with regard to the arrangement of the power semiconductor components and with regard to the potential surfaces having the first or second potential. Furthermore, it is advantageous if the switching device is formed symmetrically with respect to a second axis of symmetry in the x-direction with regard to the arrangement of the power semiconductor components and with regard to the potential surfaces having the first or second potential. In this case, the position of potential surfaces of a third potential with auxiliary potentials, such as, for example, gate potential for driving switchable power semiconductor components, is insignificant, in principle. For the purposes of a further advantageous configuration, the third potential surfaces can be included in the symmetrical configuration.

It goes without saying that the different configurations of the invention can be realized individually or in arbitrary combinations that are not mutually exclusive per se, in order to achieve improvements. In particular, the features mentioned and explained above and below can be used not only in the combinations indicated, but also in other combinations or by themselves, without departing from the scope of the present invention.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 4:
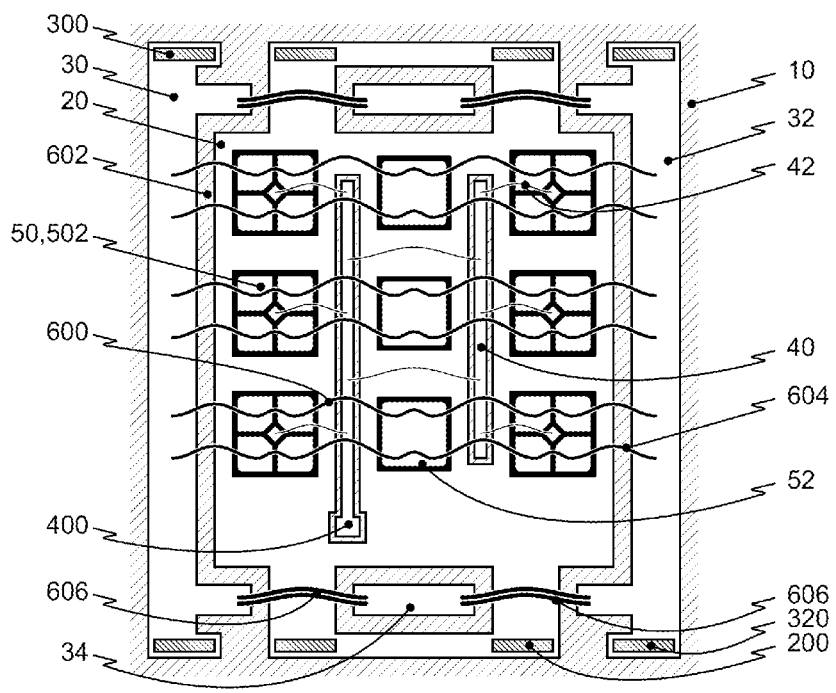
FIG. 4 shows a fourth configuration of a power electronic circuit according to the invention comprising semiconductor components arranged in a 3×3 matrix.
Figure 5:
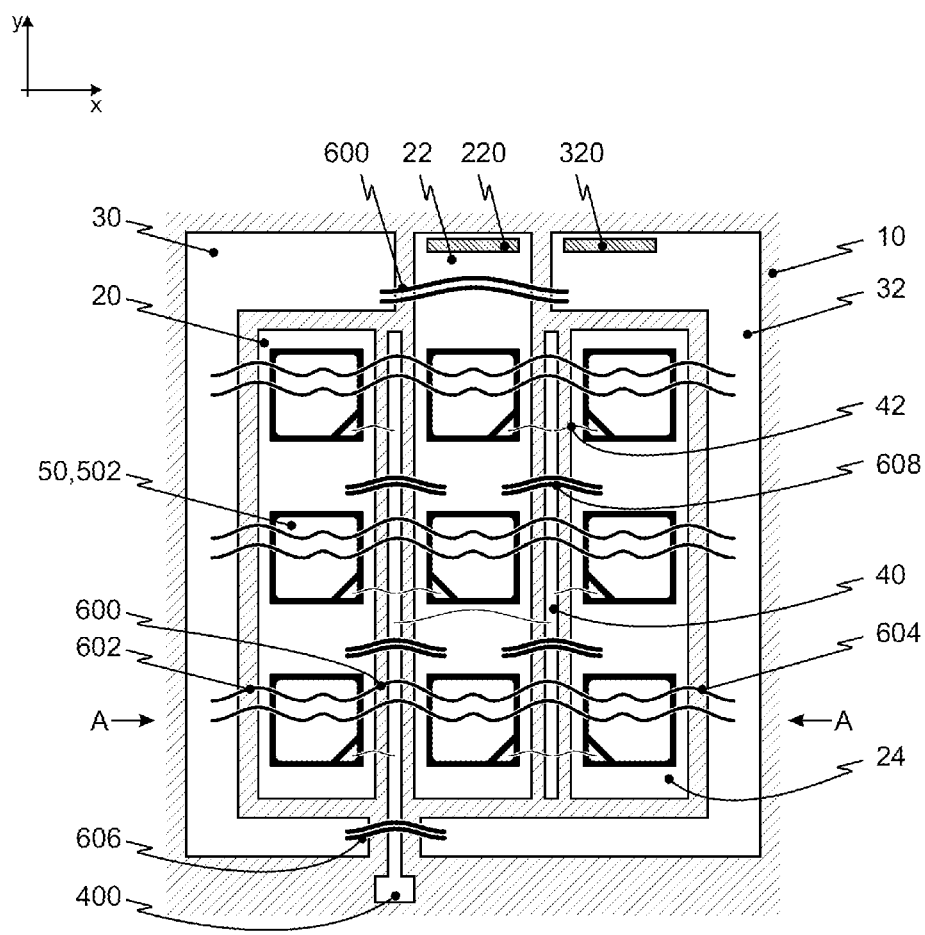
FIG. 5 shows a fifth configuration of a power electronic circuit according to the invention comprising semiconductor components arranged in a 3×3 matrix.
Figure 6:
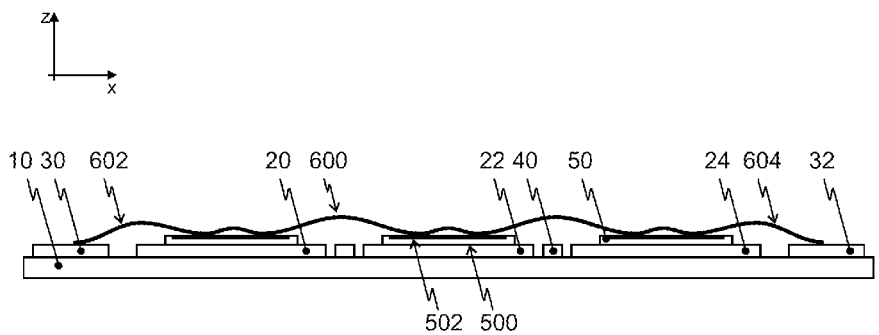
FIG. 6 shows in sectional view the fifth configuration of the power electronic circuit comprising a first configuration of the connection device.
Figure 7:
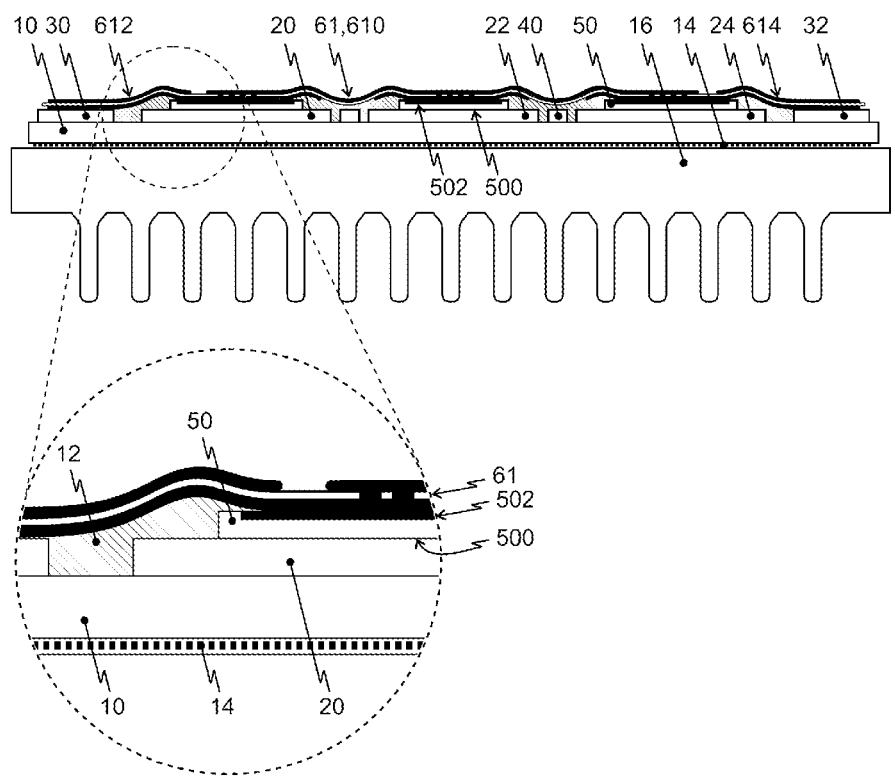
FIG. 7 shows in sectional view the fifth configuration of the power electronic circuit comprising a second configuration of the connection device.

The illustrations in FIGS. 1 to 5 show plan views of the respective switching device in an x-y-plane, while FIGS. 6 and 7 illustrate sectional views in an x-z-plane.

Figure 1:
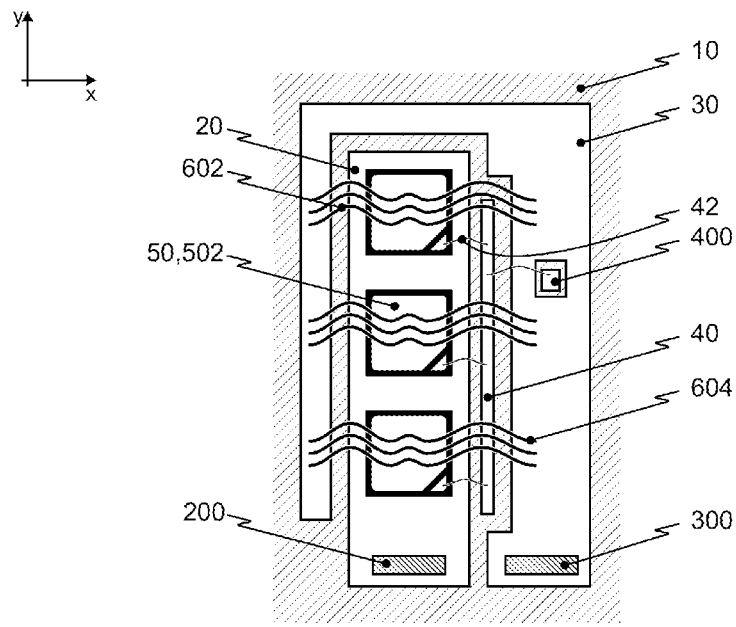
FIG. 1 shows a first configuration of a power electronic circuit according to the invention comprising semiconductor components arranged in a 1×3 matrix.

FIG. 1 shows a first configuration of a power electronic switching device according to the invention comprising semiconductor components 50 arranged in a 1×3 matrix. The illustration shows three parallel-connected semiconductor components 50, here formed as power transistors with integrated freewheeling diodes, which are arranged by their first rear-side load contact surface 500, cf. FIG. 6, on a potential surface 20 of a first potential and are electrically conductively connected thereto. This connection is effected in a routine manner in the art, that is to say for example by a solder connection or sintering connection. First potential surface 20 corresponds here to the first conductor track of the switching device.

Furthermore, the first conductor track has a contact surface 200 for external electrical connection. Contact surface 200 can correspond for example to the AC voltage load terminal in a power semiconductor module, without restricting the generality of the discussion.

The illustration furthermore shows a potential surface 30 of a second potential, which encompasses the potential surface of the first potential and thus the first conductor track in a U-shaped fashion and forms the second conductor track. Potential surface 30 likewise has a contact surface 300 for external electrical connection. Contact surface 300 corresponds for example to the DC voltage load terminal of negative polarity in the exemplary power semiconductor module.

For driving power transistors 50, the switching device furthermore comprises two potential surfaces 40, 400 of a third potential. A first 40 of these potential surfaces serves for direct connection, by a wire bond connection 42 of the gate contact surfaces of the switchable power semiconductor components 50, while the second 400 serves for external connection for example by a routine contact spring in the art. Here and hereinafter, the connection of the respective gate contact surface to an assigned potential surface of third potential is routine in the art, that is to say by the wire bond connection 42 or by a film stack, more precisely by individual parts of the film stack.

In a routine manner in the art, potential surfaces 20, 30, 40, or the conductor tracks formed thereby, are arranged on an insulating base substrate 10.

According to the invention, second load contact surfaces 502 of all power semiconductor components 50 are electrically conductively connected in each case in the x-direction, by a second connection device 602, 604, to the potential surfaces 30 of the second potential, or regions of the second conductor track, which are arranged alongside the first conductor track laterally in the x-direction. Here and in the subsequent FIGS. 2 to 5, second connection device 602, 604 is illustrated as a wire bond connection, in each case without restricting the generality of the discussion herein, cf. FIGS. 6 and 7.

Figure 2:
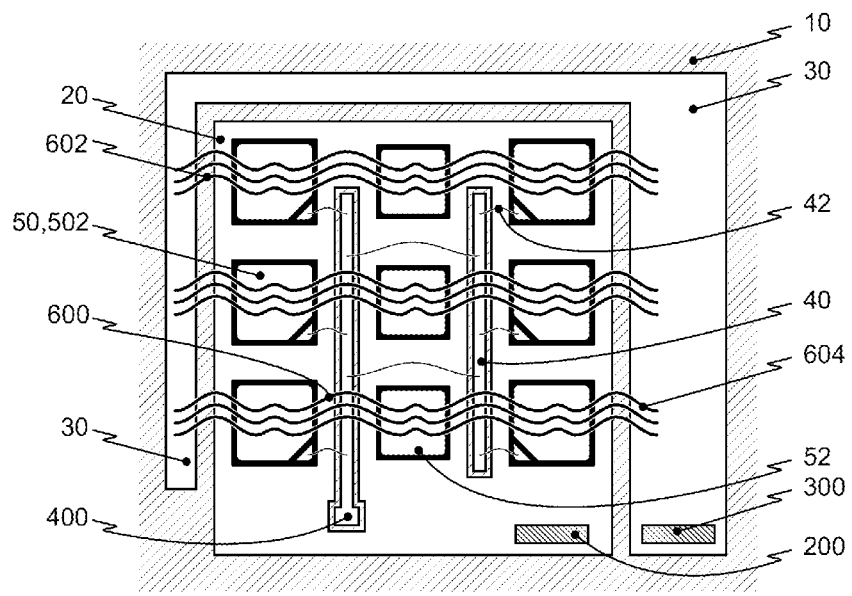
FIG. 2 shows a second configuration of a power electronic circuit according to the invention comprising semiconductor components arranged in a 3×3 matrix.

FIG. 2 shows a second configuration of a power electronic circuit according to the invention, comprising semiconductor components 50 arranged in a 3×3 matrix. This switching device is formed analogously to that in accordance with FIG. 1, in principle.

In contrast to FIG. 1, here on a potential surface 20 of first potential, that is to say first conductor track, 2×3 IGBTs 50 are arranged in each case in the y-direction, wherein a freewheeling diode 52 is in each case arranged between adjacent IGBTs 50 in the x-direction. The potential surfaces 40 of the third potential, that is to say gate potential, lie in cut-out regions of the potential surface 20 of the first potential, wherein one of the potential surfaces 40 of the third potential has a contact surface 400 for external connection by a routine contact spring in the art.

According to the invention, second load contact surfaces 502 of all power semiconductor components 50, 52 arranged alongside one another in the x-direction are electrically conductively connected to one another in series by a first connection device 600. Likewise according to the invention, second load contact surfaces 502 of the outermost power semiconductor components 50 are electrically conductively connected in each case in the x-direction, by a second connection device 602, 604, to the potential surface 30 of the second potential arranged alongside on both sides, that is to say to the second conductor track, which encompasses the first in a U-shaped fashion.

Figure 3:
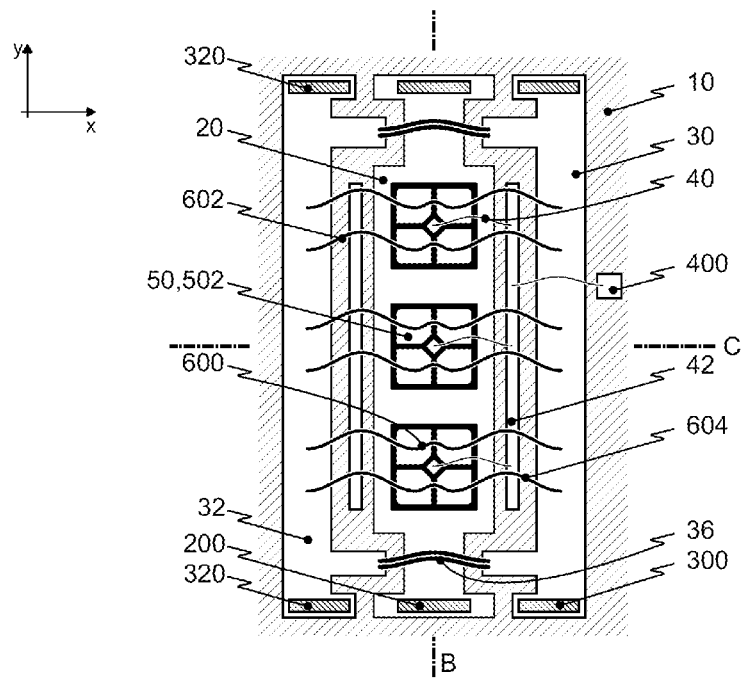
FIG. 3 shows a third configuration of a power electronic circuit according to the invention comprising semiconductor components arranged in a 1×3 matrix.

FIG. 3 shows a third configuration of a power electronic circuit according to the invention comprising semiconductor components 50 arranged in a 1×3 matrix. This switching device is in turn formed analogously to that in accordance with FIG. 1, in principle.

In contrast to FIG. 1, here on a potential surface 20 of first potential, that is to say the first conductor track, three MOS-FETs 50 are arranged in the y-direction. Two narrow potential surfaces 40 of the third potential, once again gate potential, are arranged alongside the conductor track. On each side of the first conductor track a respective potential surface 30, 32 of second potential is arranged further laterally in each case in the x-direction. The potential surfaces are connected to form a common second conductor track by a third connection means 36, here a wire bond connection without restricting the generality of the discussion.

Contact surfaces 200, 300 for external electrical connection are arranged at the ends of each potential surface 20, 30, 32 of the first and second potentials located in the y-direction.

The entire configuration is formed symmetrically with respect to a first axis B of symmetry, which runs in the y-direction centrally through potential surface 20 of the first potential. In this configuration, in terms of this symmetry by way of the requirements mentioned, namely with regard to the arrangement of power semiconductor components 50 and potential surfaces 20, 30, 32 having the first and second potentials, the arrangement of potential surfaces 40 of the third potential and the arrangement of contact surfaces 200, 300 of potential surfaces 20, 30, 32 of the first and second potentials are included in this symmetry. Furthermore, there is symmetry here with regard to the arrangement and configuration of first and second connection devices 600, 602, 604.

In addition, this configuration is symmetrical with respect to a second axis C of symmetry, which is perpendicular to the first axis of symmetry and thus runs in the x-direction. In this case, the second axis C of symmetry intersects the central power semiconductor component.

FIG. 4 shows a fourth configuration of a power electronic circuit according to the invention comprising semiconductor components arranged in a 3×3 matrix. This switching device combines essential features of FIG. 2 with features of FIG. 3.

The current valve here is in turn formed by six power transistors 50, specifically IGBTs, and three antiparallel-connected freewheeling diodes 52. IGBTs 50 are arranged in a first and third column, and diodes 52 in a second column arranged therebetween. All these power semiconductor components 50, 52 are arranged on a potential surface 20 of the first potential, which has cutouts for potential surfaces 40 of the third (gate) potential, and forms the first conductor track. Furthermore, potential surface 20 of the first potential has further cutouts in which further potential surfaces 34 of the second potential are arranged. The latter supplement both of the two potential surfaces 30, 32 of the second potential located laterally alongside the potential surface 20 of the first potential to form a second conductor track.

For this purpose, left lateral potential surface 30 of the second potential is electrically conductively connected to additional potential surfaces 34 by a third connection device 606. Likewise, right lateral potential surface 32 of the second potential is connected to the additional potential surfaces 34 of the second potential.

This configuration, too, is formed symmetrically with respect to a first axis of symmetry, which runs in the y-direction centrally through the potential surface 20 of the first potential. This symmetry is essential for and restricted to the arrangement of power semiconductor components 50, 52, the formation of first and second connection devices 600, 602, 604 and the arrangement of potential surfaces 20, 30, 32, 34 having the first and second potentials. Such symmetry ultimately leads to a uniform current distribution within potential surfaces 20, 30, 32, 34 and thus finally to a uniform loading of all power semiconductor components 50, 52 forming the current valve and, as a result, to an outstanding ratio of semiconductor area and loading capacity of the power electronic switching device during operation.

FIG. 5 shows a fifth configuration of a power electronic circuit according to the invention comprising semiconductor components arranged in a 3×3 matrix. The fundamental construction is the same as that in accordance with FIG. 4.

However, here the first conductor track is formed from three potential surfaces 20, 22, 24 of first potential, which are electrically conductively connected to one another by a fourth connection device 608, which is basically formed in a routine manner in the art. On each of the potential surfaces 20, 22, 24 of the first potential, that is to say the first conductor track, three MOS-FETS 50 are arranged, that is to say a total of nine power semiconductor components. Arranged between these potential surfaces and bridged by fourth connection device 608 are two potential surfaces 40 of the third potential, once again gate potential. These are electrically conductively connected here, as also in the previous figures, to the gate contact surfaces of switchable power semiconductor components 50, that is to say of the IGBTs or of the MOS-FETs, in a routine manner in the art by a wire bond connection or by the film stack.

The contact surface 200 for the external electrical connection of the first conductor track here is arranged on the central potential surface 22 of the first potential.

The illustration furthermore shows two potential surfaces 30, 32 of the second potential which are arranged laterally with respect to the first conductor track in the x-direction and which are electrically conductively connected to one another by a third connection device 606.

The first and second connection devices 600, 602, 604 are formed according to the invention in the manner as described by way of example with regard to FIG. 2.

FIGS. 6 and 7 show a section through the configuration of the power electronic switching device in accordance with FIG. 5 in section along the sectional line A-A.

FIG. 6 shows in sectional view the fifth configuration of the power electronic circuit comprising a first configuration of the connection device.

The illustration shows an insulating body 10 as substrate 10 of the power electronic switching device. Conductor tracks are arranged on substrate 10. In this case, the first conductor track is formed from three potential surfaces 20, 22, 24 of the first potential, which—cf. FIG. 5 and not illustrated here—are electrically conductively connected to one another. A respective power semiconductor component 50 is illustrated in each case on potential surfaces 20, 22, 24, power semiconductor component 50 being electrically conductively connected by its first load contact surface 500 to assigned potential surface 20, 22, 24 of the first potential.

The illustration furthermore shows two potential surfaces 30, 32 of the second potential which are arranged alongside the first conductor track laterally on both sides in the x-direction. For the sake of completeness, potential surfaces 40 of the third potential are also illustrated.

Second load contact surfaces 502 of power semiconductor components 50, arranged on the main surface of power semiconductor components 50 that is situated opposite potential surfaces 20, 22, 24, are electrically conductively connected to one another by a first connection device 600, here formed as a wire bond connection. The respective outermost power semiconductor components 50 are electrically conductively connected to the respectively assigned potential surface 30, 32 of the second potential, adjacent laterally in the x-direction, by a second connection device 602, 604, here likewise formed as a wire bond connection. Here, in a particularly preferred manner, first and second connection devices 600, 602, 604 degenerate into an integral wire bond connection, that is to say a wire bond connection consisting of a plurality of respectively continuous wires, one of which is illustrated, the wire bond connection extending from left potential surface 30 of the second potential via second load contact surfaces 502 as far as right potential surface 32 of the second potential.

FIG. 7 shows in sectional view the fifth configuration of the power electronic circuit comprising a second configuration of first and second connection devices 610, 612, 614. Substrate 10, potential surfaces 20, 22, 24, 30, 32, 40, and also power semiconductor components 50 are identical to those in accordance with FIG. 6. The illustration additionally shows, as an example of a typical application, a heat sink 16 and a thermally conductive connection layer 14 between the latter and the power electronic switching device.

What is different to FIG. 6 in the configuration of the power electronic switching device is the configuration of the first and second connection devices, which here degenerates into a routine film stack 61 in the art, film stack 61 comprising both of the connection devices.

Film stack 61 here consists of two inherently structured metallic films with an electrically insulating film arranged therebetween. The second metallic film, facing away from power semiconductor components 50, forms first connection device 610 by virtue of the fact that above second load contact surfaces 502 of power semiconductor components 50 there are arranged plated-through holes through the insulating film connecting the second metallic film at these locations to the first metallic film, facing power semiconductor components 50. The first metallic film is electrically conductively connected to second contact surfaces 502 of power semiconductor components 50 in a routine manner in the art, for example, by a solder connection, adhesive connection or sintering connection.

The respective second connection device 612, 614 is formed by the respective first metallic film, which extends from the respective outermost power semiconductor component 50 in the x-direction, that is to say the left or right power semiconductor component, respectively, to assigned potential surface 30, 32 of the second potential that is adjacent laterally in the x-direction. The first metallic film is electrically conductively connected to this respective potential surface 30, 32 by, for example, a solder connection, adhesive connection, or sintering connection.

For internal insulation, a routine potting compound 12 in the art can be arranged between the connection devices and the substrate and/or the potential surfaces. Potting compound 12 is generally also provided in the case of a configuration of the connection devices, both the first and second connection devices and the third and fourth connection devices described above, as a wire bond connection, although then in a manner covering the latter.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power electronic switching device comprising:
   a substrate having a plurality of potential surfaces, said plurality of potential surfaces having at least first and second potentials, said first and second potentials being different, and each of said first and second potentials being assigned to at least one of said potential surfaces;
   a first conductor track, formed by at least one of said plurality of potential surfaces of said first potential;
   a plurality of semiconductor components arranged on said first conductor track in an n×m matrix, oriented in the x-y-direction, said plurality of semiconductor components being connected in parallel with one another and forming a current valve, said semiconductor components also having first and second load contact surfaces; and
   a second conductor track, formed by at least one of said plurality of potential surfaces of said second potential, said second conductor track being arranged alongside said first conductor track on a side thereof in the x-direction;
   wherein said semiconductor components are electrically conductively connected to said first conductor track by their respective first load contact surface facing said first conductor track;
   wherein said second load contact surfaces of the n semiconductor components arranged alongside one another in the x-direction are conductively connected to one another; and
   wherein each respective outermost semiconductor components in the x-direction are electrically conductively connected to said potential surface of said second potential arranged alongside it.

2. The power electronic switching device of claim 1, wherein the electrically conductive connections between said second load contact surfaces of said power semiconductor components to one another are formed by a first connection device and the respective electrically conductive connections between said second load contact surfaces of said power semiconductor components and the assigned potential surfaces of said second potential are formed by a second connection device.

3. The power electronic switching device of claim 2, wherein said first and second connection devices are formed essentially identically.

4. The power electronic switching device of claim 2, wherein at least one of said first and second connection devices is formed as a wire bond connection.

5. The power electronic switching device of claim 2, wherein at least one of said first and second connection device is formed as a film stack.

6. The power electronic switching device of claim 1, wherein at least one said potential surface of said second potential encompasses said first conductor track in a U-shaped fashion and has regions which are arranged alongside said first conductor track laterally in the x-direction.

7. The power electronic switching device of claim 1, wherein two potential surfaces of said second potential are arranged alongside said first conductor track laterally in the x-direction, and wherein said two potential surfaces of said second potential are electrically conductively connected to one another by a third connection device.

8. The power electronic switching device of claim 7, wherein said third connection device is formed as one of a wire bond connection and a film stack.

9. The power electronic switching device of claim 1, further comprising:
a fourth connection device for electrically conductively connecting to one another a plurality of potential surfaces of said first potential.

10. The power electronic switching device of claim 9, wherein said fourth connection device is formed as one of a wire bond connection and a film stack.

11. Power electronic switching device according to any of the preceding claims, wherein the switching device is formed symmetrically with respect to a first axis (B) of symmetry in the y-direction with regard to the arrangement of said power semiconductor components and with regard to said potential surfaces of said first and second potentials.

12. The power electronic switching device of claim 11, wherein the switching device is formed symmetrically with respect to a second axis (C) of symmetry in the x-direction with regard to the arrangement of said power semiconductor components and with regard to said potential surfaces of said first and second potentials.

13. The power electronic switching device of claim 12, wherein the symmetry is formed with regard to the arrangement and configuration of said first and second connection devices.

14. The power electronic switching device of claim 11, wherein the symmetry is formed with regard to the arrangement and configuration of said first and second connection devices.

* * * * *